United States Patent [19]
Smith

[11] Patent Number: 5,999,454
[45] Date of Patent: Dec. 7, 1999

[54] SENSE AMPLIFIER FOR FLASH MEMORY

[75] Inventor: Malcolm H. Smith, Macungie, Pa.

[73] Assignee: Lucent Technologies, Inc., Murray Hill, N.J.

[21] Appl. No.: 09/136,360

[22] Filed: Aug. 19, 1998

[51] Int. Cl.$^6$ .................................................. G11C 16/06
[52] U.S. Cl. ................................ 365/185.21; 365/185.25
[58] Field of Search .......................... 365/185.2, 185.21, 365/185.25, 183.33

[56] References Cited

U.S. PATENT DOCUMENTS

| | | | |
|---|---|---|---|
| 4,062,000 | 12/1977 | Donnelly | 365/203 |
| 5,519,348 | 5/1996 | Tanoi | 327/205 |
| 5,563,827 | 10/1996 | Lee et al. | 365/185.23 |
| 5,621,686 | 4/1997 | Alexis | 365/185.21 |
| 5,638,322 | 6/1997 | Lacey | 365/185.21 |
| 5,701,265 | 12/1997 | Calligaro et al. | 365/185.21 |
| 5,729,492 | 3/1998 | Campardo | 365/185.21 |
| 5,748,534 | 5/1998 | Dunlap et al. | 365/185.21 |
| 5,754,010 | 5/1998 | Caravella et al. | 365/203 |

*Primary Examiner*—Trong Phan
*Attorney, Agent, or Firm*—Dickstein Shapiro Morin & Oshinsky LLP

[57] ABSTRACT

The present invention is embodied in a method and apparatus for sensing the logic state of a flash memory cell utilizing a current mode sense amplifier circuit that is less susceptible to noise. The sense amplifier consists of a controlled current source with mirroring, an integrator and a comparator. In the sensing phase, a cell with a stored low logic level will cause a first current to flow. The first current will be mirrored by a second current. The second current is integrated and compared against a reference voltage to determine the logic state of the cell. By integrating and comparing the mirrored current, the sense amplifier circuit is less susceptible to spurious signals caused by noise.

63 Claims, 4 Drawing Sheets

SENSE AMPLIFIER FOR FLASH MEMORY

BACKGROUND OF THE INVENTION

1. Field of the Invention

The present invention relates to an electronic circuit for sensing the logic state of a memory cell, and in particular to a sense amplifier and associated circuitry for reading data from a flash memory circuit that operates in a current mode.

2. Description of the Related Art

Common types of non-volatile memory, such as EPROM (Electrically Programmable Read Only Memory), EEPROM (Electrically Erasable Programmable Read Only Memory) and Flash memory use a charge on a memory cell's floating gate to control the threshold voltage (Vt) of the memory cell and thereby indicate the binary state of the cell. Typically, such memory cells have two possible binary states, one (e.g. "0") indicated by a high threshold voltage and one (e.g. "1") indicated by a low threshold voltage. Gathering electrons on a memory cell's floating gate increases the cell's threshold voltage and is referred to as writing or programming the memory cell. Erasing a memory cell removes the electrons from the floating gate and reduces the threshold voltage.

Figure 1A:
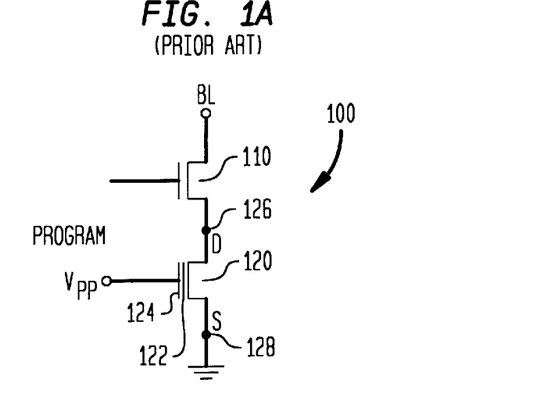
FIG. 1A Prior Art illustrates a flash memory cell in Program mode.

A Flash memory is an integrated circuit that includes an array of electrically programmable and electrically erasable memory cells. A basic flash memory cell 100 is shown in FIG. 1A. Flash memory cell 100 includes an access transistor 110 and a double-polysilicon storage transistor 120. Storage transistor 120 has a floating polysilicon gate 122 that is isolated in silicon dioxide and capacitively coupled to a polysilicon control gate 124. Storage transistor 120 also has a region of silicon dioxide between the floating gate 122 and a drain 126 that is thin enough to permit electrons to tunnel to and from floating gate 122 when the proper bias voltages are applied to the terminals of storage transistor 120.

As shown in FIG. 1A, storage transistor 120 is programmed by grounding its source 128, applying approximately 5 to 6 volts to its drain 126, and connecting its control gate 124 to a programming voltage Vpp that is high relative to the operating voltage Vcc. A typical value for Vpp is 12 volts, while a typical value for Vcc is 5 volts. With storage transistor 120 biased by the application of Vpp, electrons travel through the tunnel oxide to the floating gate 122, leaving the floating gate 122 with a net negative charge. This net negative charge shifts the threshold voltage Vt of storage transistor 120 in the positive direction to a voltage that is greater than Vcc.

Figure 1B:
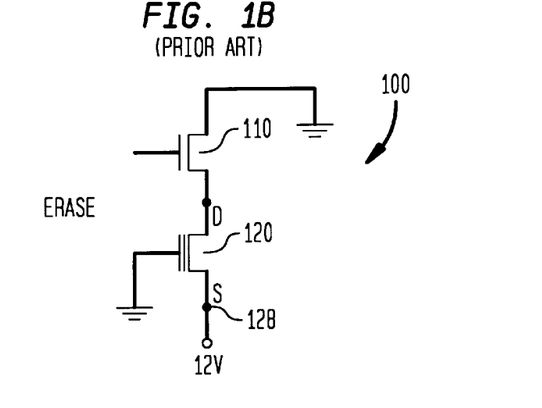
FIG. 1B Prior Art illustrates a flash memory cell in Erase mode.

As shown in FIG. 1B, storage transistor 120 is erased by grounding control gate 124 and applying a relatively high voltage (e.g., 12 volts) to the source 128. This bias allows electrons to tunnel away from the floating gate 122 through the tunnel oxide to be carried away by the large positive voltage on source 128. The loss of electrons on the floating gate 122 shifts the threshold voltage Vt of storage transistor 120 in the negative direction to a voltage that is less than Vcc.

When erasing storage transistor 120, it is possible to remove too many electrons from floating gate 122, resulting in excess positive charge on floating gate 122. This condition is commonly known as "over-erase." Access transistor 110 is provided to prevent storage transistor 120, in the event that storage transistor 120 is over-erased, from conducting as a result of excess positive charge on floating gate 122.

After flash memory cell 100 is programmed or erased, the state of the storage transistor may then be "read" by determining whether the storage transistor conducts when access transistor 110 is turned on by application of a voltage to the gate of access transistor 110. If the storage transistor 120 is programmed, i.e., there is a net negative charge on floating gate 122, storage transistor 120 will not conduct when access transistor 110 is turned on since the threshold voltage Vt is a voltage greater than Vcc. If, on the other hand, the storage transistor is erased, i.e., there is no charge on floating gate 122, storage transistor 120 will conduct when access transistor 110 is turned on since the threshold voltage Vt is less than Vcc.

Figure 1C:
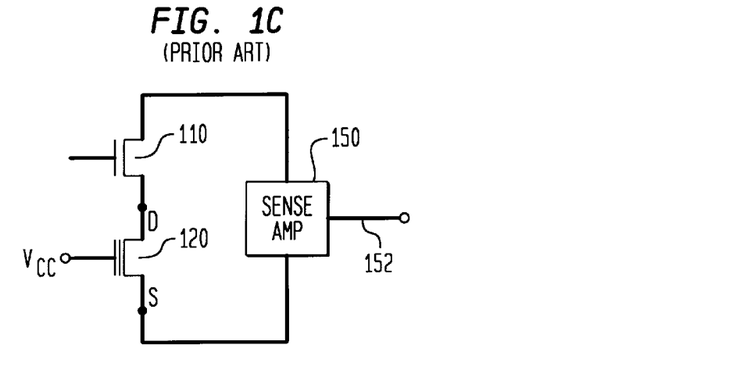
FIG. 1C Prior Art illustrates a current mode sense amplifier used to detect the state of a flash memory cell.

As shown in FIG. 1C, sense amplifier 150, coupled across the series connected access transistor 110 and storage transistor 120 of cell 100, determines whether storage transistor 120 conducts based upon the current that flows through the sense amplifier 150. A signal corresponding to the state of cell 100, i.e., either a logic high or a logic low, as read by the sense amplifier 150 is output on line 152.

However, there are problems with the conventional current mode sense amplifiers used to sense whether the storage transistor 120 conducts or not, i.e., whether there is any current flow. Since the amount of current that will flow if the cell 100 has been erased is relatively small, the sense amplifier must be sensitive enough to determine whether the threshold current indicating the cell 100 is erased has been exceeded. This increased sensitivity makes the sense amplifier subject to possible erroneous readings caused by noise signals. A spurious noise signal may cause minute currents to flow into sense amplifier 150 during a read operation, causing the sense amplifier 150 to erroneously determine that cell 100 has been erased. Thus there exists the need for a current mode sense amplifier that provides increased immunity to noise signals to prevent erroneous readings.

SUMMARY OF THE INVENTION

The present invention provides a unique method and apparatus for a current mode sense amplifier that is less susceptible to erroneous readings caused by spurious noise signals.

The sense amplifier according to the present invention includes a first circuit which will selectively provide a first current path in accordance with the level of charge stored in the memory cell being read. A second circuit provides a second current path for a second current flow depending upon whether or not current flows through the first current path. An integrating component integrates the second current flow to produce a voltage signal, and a third circuit outputs a signal representative of the logic state of the memory cell based on the output of the integrating component.

In accordance with a first embodiment of the present invention, the sense amplifier includes an integrating capacitor and a comparator. A precharge signal is used to supply a fixed reference voltage. If the cell has been programmed, the integrated current fails to pass a reference value, and the comparator will not switch states, indicating a low logic level stored in the cell. If the cell has been erased, the current source must continue to supply current to maintain its value at the output of the cell, so the integrated value of the current will be greater than the reference, causing the comparator to switch states and indicate a high logic level stored in the cell.

In accordance with a second embodiment of the present invention, the third circuit function is performed using an inverter and a Schmitt trigger. Additionally, the integration of the second current is performed by a MOS transistor.

These and other advantages and features of the invention will become apparent from the following detailed description of the invention which is provided in connection with the accompanying drawings.

DETAILED DESCRIPTION OF THE PREFERRED EMBODIMENTS

The present invention will be described as set forth in the preferred embodiments illustrated in FIGS. 2–4. Other embodiments may be utilized and structural or logical changes may be made without departing from the scope of the present invention.

Figure 2:
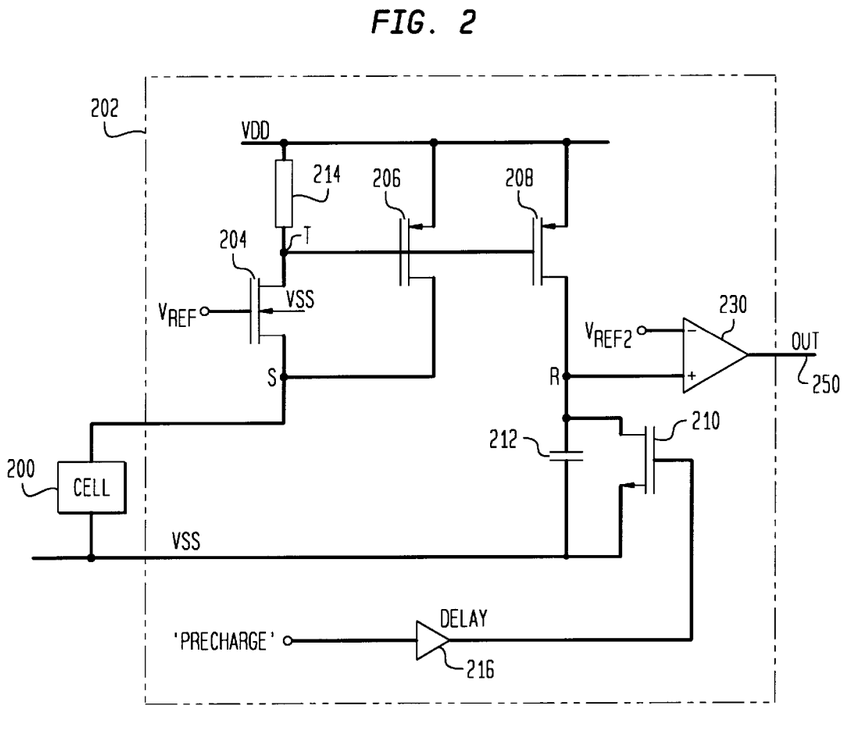
FIG. 2 illustrates in schematic diagram form a current mode sense amplifier circuit according to a first embodiment of the present invention.

FIG. 2 illustrates in schematic diagram form a current mode sense amplifier circuit according to a first embodiment of the present invention. Flash memory cell 200, which may be provided as part of an integrated circuit, is connected to current mode sense amplifier circuit 202. Cell 200 operates as previously described with respect to FIGS. 1A and 1B. Sense amplifier circuit 202 is used to detect the state of cell 200 based on the current flow and output a signal on line 250 representing the state of cell 200.

Sense amplifier 202 includes a source-follower N-channel MOS transistor 204, resistor 214, P-channel MOS transistors 206,208, integrating capacitor 212, delay 216, N-channel MOS transistor 210, and comparator 230. Although specific components are shown, the invention need not be so limited to those components shown, and any structural changes may be made without departing from the scope of the present invention.

The circuit operates in the following manner. When the voltage at the source of source-follower transistor 204, labeled node S, is less than Vref−Vt, transistor 204 will conduct to bring the voltage on node S up toward VDD. This conduction current will also flow through resistor 214, causing a voltage drop across resistor 214. The voltage at node T will turn on P-channel MOS transistor 206 to supply extra current to node S, and also turn on P-channel MOS transistor 208. Thus, when current flows through P-channel MOS transistor 206, the current will be mirrored, i.e., will also flow, through P-channel MOS transistor 208. The currents flowing through transistors 206 and 208 may or may not be identical depending upon the size of the transistors used and need not be identical for the present invention.

The current flowing through P-channel MOS transistor 208 will be integrated by an integrating component such as capacitor 212. The integration of the current through transistor 208 will produce a voltage signal on node R which is proportional to the current and length of time it has been flowing and inversely proportional to the capacitance of capacitor 212. If the integrated current is sufficient to make the voltage on node R greater than Vref2, comparator 230 will output a signal on line 250 indicating a low threshold voltage in cell 200, i.e., cell 200 has been erased. If the integrated current is not sufficient to increase the voltage at node R to exceed Vref2, comparator 230 will output a signal indicating a high threshold voltage in cell 200, i.e., cell 200 has been programmed.

For example, assume cell 200 has a stored high, e.g. "1", binary state, i.e., a low threshold voltage. The floating gate of the storage transistor of cell 200 would be charged with a net negative charge resulting in a threshold voltage Vt less than Vcc. Before the cell 200 can be read, node R must be precharged to a fixed reference voltage. This is done by turning on N-channel transistor 210 by a precharge signal through delay 216. Delay 216 will prevent the cell 200 from being read during the precharge phase. To read cell 200, its access transistor must be turned on. When the access transistor for cell 200 is turned on, cell 200 will conduct, since it has a low threshold voltage. This will cause the voltage at node S to drop to less than Vref−Vt Typically, 1.5 V is preferable for the value of Vref. When the voltage at node S is less than Vref−Vt, transistor 204 will turn on. The turning on of transistor 204 causes a current to flow through resistor 214. The current flowing through resistor 214 causes an associated voltage drop across resistor 214, thus decreasing the voltage at node T. The decreased voltage at node T, which is connected to the gate of P-channel transistors 206, 208, will cause transistors 206, 208 to turn on and conduct current. Thus, current will flow through both transistor 208 and transistor 206.

The current flowing through transistor 208 will be integrated by capacitor 212. The integration of the current will produce a voltage signal on node R which is proportional to the current and length of time it has been flowing and inversely proportional to the capacitance of capacitor 212. The voltage signal at node R is input to comparator 230 where it is compared with a second reference voltage Vref2. Reference voltage Vref2 is set to a value such that when cell 200 conducts and causes current to flow through transistor 208, the integrated current will cause the voltage at node R to exceed Vref2 and comparator 230 will switch the output 250, indicating a high logic level for cell 200.

Now for example, assume cell 200 is erased, i.e., it has a logic low, e.g. "0", stored in it. The floating gate of the storage transistor for cell 200 will be charged with a net negative charge resulting in a threshold voltage Vt greater than Vcc. To read the contents of cell 200, node R must first be precharged as described above. When the access transistor for cell 200 is turned on, cell 200 will not conduct since it has a high threshold voltage. Since the cell 200 does not conduct, the voltage at node S will float to Vref−Vt The voltage Vref−Vt at node S will be high enough to maintain transistor 204 in an off state, thus transistor 204 will remain off and not conduct. Since transistor 204 does not conduct, there will be no current flowing through resistor 214, and the voltage at node T will remain at a level so as to keep transistors 206 and 208 off. Since transistor 208 will remain off, no current will flow to integrating capacitor 212, and thus the voltage at node R will not rise to a level exceeding Vref2. Comparator 230 will not switch since the voltage at node R remains less than Vref2, and output 250 will remain in the same state, indicating a low logic level stored in cell 200.

Figure 3:
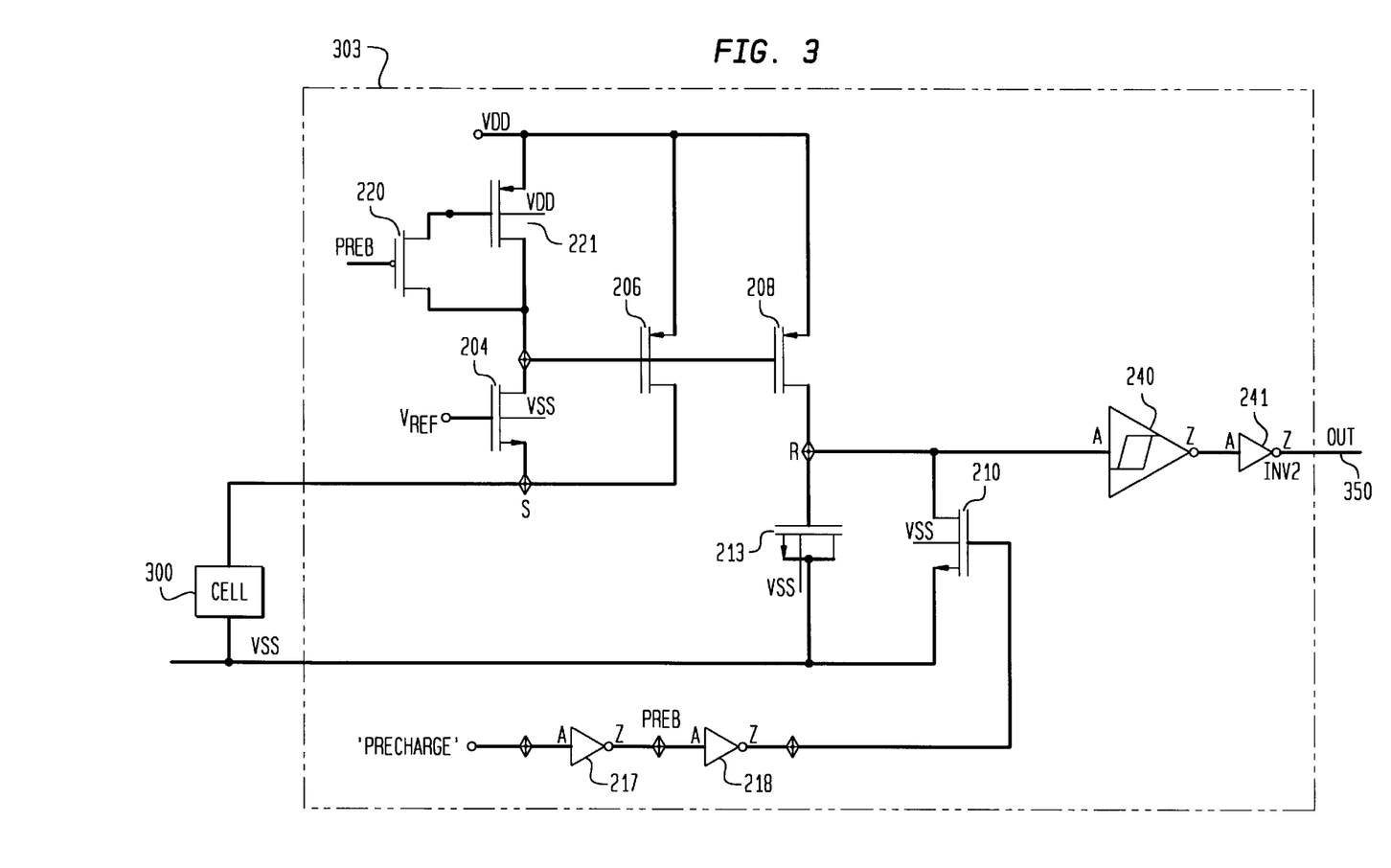
FIG. 3 illustrates in schematic diagram form a current mode sense amplifier circuit according to a second embodiment of the present invention.

FIG. 3 illustrates in schematic diagram form a current mode sense amplifier circuit according to a second embodiment of the present invention. Flash memory cell 300, which may be provided as part of an integrated circuit, is connected to current mode sense amplifier circuit 303. Cell 300 operates as previously described with respect to FIGS. 1A and 1B. Sense amplifier circuit 303 is used to detect the state of cell 300 based on current flow and provide an output signal 350 representing the state of cell 300.

Sense amplifier 303 is constructed similarly to sense amplifier 202 of FIG. 2. Like items are given like identifying numerals and operate as described with respect to FIG. 2. Sense amplifier 303 includes an N-channel source-follower transistor 204, P-channel transistor 220, P-channel transistor 221, P-channel MOS transistors 206, 208, N-channel transistor 213, inverters 217, 218 which form a delay, N-channel transistor 210, Schmitt trigger 240 and inverter 241. The invention need not be limited to the specific components shown.

The circuit 303 of FIG. 3 operates in the following manner. When the voltage at the source of source-follower transistor 204, labeled node S, is less than Vref−Vt, transistor 204 will conduct to bring the voltage on node S up toward VDD. This current will also flow through transistor 221, which is connected as an active resistor in the sense phase and a diode in the precharge phase by MOS transistor 220. The current through transistor 221 will cause a voltage drop across transistor 221, which will turn on transistor 206 to supply extra current to node S, and also turn on transistor 208. Thus, when current flows through transistor 206, the current will be mirrored, i.e., will also flow, through transistor 208. The current may or may not be identical depending upon the size of the transistors used and need not be identical for the present invention.

The current flowing through transistor 208 will be integrated by transistor 213. The integration of the current will produce a voltage signal on node R which is proportional to the current and length of time it has been flowing. If the integrated current is sufficient to make the voltage on node R increase to a level high enough to activate Schmitt trigger 240, Schmitt trigger 240 will output a signal to inverter 241 which will output a signal on line 350 indicating a stored charge in cell 300, i.e., cell 300 has been programmed to a logic high. If the integrated current is not sufficient to increase the voltage at node R to activate Schmitt trigger 240, Schmitt trigger 240 will output a different signal to inverter 241 which will output a signal on line 350 indicating no stored charge in cell 300, i.e., a logic low.

For example, assume cell 300 has a stored high binary state, i.e., a low threshold voltage. The floating gate of the storage transistor of cell 300 would be charged with a net negative charge resulting in a threshold voltage Vt less than Vcc. Before the cell 300 can be read, node R must be precharged to a fixed reference voltage. This is done by turning on transistor 210 by a precharge signal through a delay consisting of inverters 217,218. A delay in the precharge signal will prevent the cell 300 from being read during the precharge phase. To read cell 300, its access transistor must be turned on. When the access transistor for cell 300 is turned on, cell 300 will conduct since it has a low threshold voltage. This will cause the voltage at node S to drop to less than Vref−Vt Typically, 1.5 V is preferable for the value of Vref. When the voltage at node S is less than Vref−Vt, transistor 204 will turn on. The turning on of transistor 204 causes a current to flow through transistor 221. The current flowing through transistor 221 causes an associated voltage drop across transistor 221, thus decreasing the voltage at node T. The decreased voltage at node T, which is connected to the gate of transistors 206, 208, will cause transistors 206, 208 to turn on and conduct current.

The current flowing through transistor 208 will mirror that flowing through transistor 206, i.e., if current flows through transistor 206, current will also flow through transistor 208.

The current flowing through transistor 208 will be integrated by transistor 213. The integration of the current will produce a voltage signal on node R which is proportional to the current and length of time it has been flowing. The voltage signal at node R is input to Schmitt trigger 240, which will output a signal to inverter 241 depending upon the signal input from node R. The signal at node R when cell 300 conducted will cause Schmitt trigger 240 to output a signal to inverter 241 which will output a signal on line 350 indicating a high logic level for cell 300.

Now for example, assume cell 300 has a logic low stored in it, i.e., a high threshold voltage. The floating gate of the storage transistor for cell 300 will be charged with a net negative charge resulting in a threshold voltage Vt greater than Vcc. To read the contents of cell 300, node R must first be precharged as described above. When the access transistor for cell 300 is turned on, cell 300 will not conduct since it has a high threshold voltage. Since the cell 300 does not conduct, the voltage at node S will float to Vref−Vt The voltage Vref−Vt at node S will be high enough to maintain transistor 204 in an off state, thus transistor 204 will remain off and not conduct. Since transistor 204 does not conduct, there will be no current flowing through transistor 221, and the voltage at node T will remain at a level so as to keep transistors 206 and 208 off. Since transistor 208 will remain off, no current will flow to integrating transistor 213, and thus the voltage at node R will not rise to a level to cause Schmitt trigger 240 to output a signal to inverter 241 indicating a high logic state for cell 300. The output signal on line 350 as output by inverter 241 will indicate a low logic level stored in cell 300.

By integrating the mirrored current produced when the cell conducts instead of directly sensing the current flowing from the cell, the sense amps according to the present invention are much less susceptible to erroneous readings caused by spurious noise signals.

Figure 4:
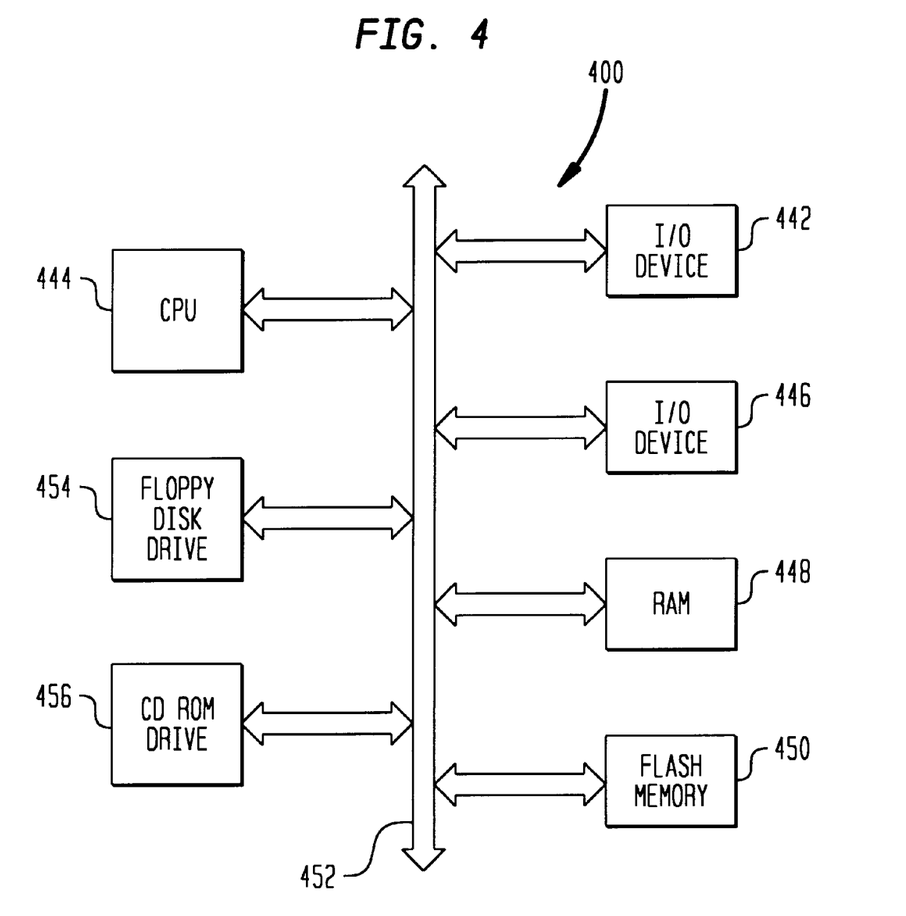
FIG. 4 illustrates in block diagram form a typical processor controlled system in which the present invention would be used.

A typical processor system which includes a Flash memory with sense amplifiers according to the present invention is illustrated generally at 400 in FIG. 4. A computer system is exemplary of a device having digital circuits which include Flash memory devices. Most conventional computers include memory devices permitting the storage of significant amounts of data. The data is accessed during operation of the computers. Other types of dedicated processing systems, e.g. radio systems, camera systems, television systems, GPS receiver systems, telephones and telephone systems also contain memory devices which can utilize the present invention.

A processor system, such as a computer system, generally comprises a central processing unit (CPU) 444 that communicates with an input/output (I/O) device 442 over a bus 452. A second I/O device 446 is illustrated, but may not be necessary depending upon the system requirements. The computer system 400 also includes random access memory (RAM) 448, Flash memory 450, and may include peripheral devices such as a floppy disk drive 454 and a compact disk (CD) ROM drive 456 which also communicate with CPU 444 over the bus 452. Flash memory 450 is an integrated circuit which includes a sense amplifier circuit, as previously described with respect to FIGS. 2 or 3.

Utilizing the method of the present invention, the cells of Flash memory 450 can be accurately read to determine their logic state. It must be noted that the exact architecture of the computer system 400 is not important and that any combination of computer compatible devices may be incorporated into the system.

Reference has been made to a preferred embodiment in describing the invention. However, additions, deletions, substitutions, or other modifications which would fall within the scope of the invention defined in the claims may be found by those skilled in the art and familiar with the disclosure of the invention. Any modifications coming within the spirit and scope of the following claims are to be considered part of the present invention.

What is claimed as new and desired to be protected by Letters Patent of the United States is:

1. An apparatus for sensing a logic state of a memory cell, said apparatus comprising:
   a first circuit which selectively provides current in a first current path in accordance with a stored charge level read from a memory cell, said first circuit comprising;
      a first transistor having a source, a drain, and a gate, said source being connected to said memory cell;
      a resistive element connected between a supply voltage and said drain of said first transistor; and
      a second transistor connected between said supply voltage and said source of said first transistor, said second transistor having a gate connected to said drain of said first transistor;
   a second circuit coupled to said first circuit which provides current in a second current path when there is current flow in said first current path;
   an integrator for integrating said current in said second current path; and
   a third circuit responsive to an output of said integrator which provides an output signal representing a logic state corresponding to said stored charge level read from said memory cell.

2. The apparatus according to claim 1, wherein said second circuit comprises:
   a third transistor connected between said supply voltage and a reference node, said integrator being connected to said reference node.

3. The apparatus according to claim 1, wherein said gate of said first transistor is connected to a reference voltage.

4. The apparatus according to claim 2, wherein a gate of said third transistor is connected to said gate of said second transistor.

5. The apparatus according to claim 1, wherein said integrator comprises:
   an integrating component connected between said reference node and a second supply voltage.

6. The apparatus according to claim 5, wherein said integrating component is a capacitor.

7. The apparatus according to claim 5, wherein said integrating component is a transistor.

8. The apparatus according to claim 5 further comprising:
   a precharge circuit, said precharge circuit providing a fixed reference voltage at said reference node before said stored charge level is read from said memory cell.

9. The apparatus according to claim 8, wherein said precharge circuit further comprises:
   a fourth transistor connected between said reference node and said second supply voltage; and
   a precharge signal connected to a gate of said fourth transistor through a delay element.

10. The apparatus according to claim 9, wherein said delay element comprises at least one inverter.

11. The apparatus according to claim 5, wherein said second supply voltage is a ground potential.

12. The apparatus according to claim 1, wherein said third circuit comprises:
   a comparator having a first input, a second input and an output, said first input being connected to said reference node, said second input being connected to a second reference voltage; and
   an output line, said output line being connected to said output of said comparator and conducting an output signal determined by comparing a voltage at said reference node and said second reference voltage.

13. The apparatus according to claim 12, wherein when said voltage at said reference node increases above said second reference voltage, said output of said comparator switches.

14. The apparatus according to claim 1, wherein said third circuit comprises:
   a Schmitt trigger, said Schmitt trigger having an input and an output, said input being connected to said reference node.

15. The apparatus according to claim 14 further comprising:
   an inverter connected to said output of said Schmitt trigger.

16. The apparatus according to claim 1, wherein said resistive element is a resistor.

17. The apparatus according to claim 1, wherein said resistive element is a MOS transistor.

18. The apparatus according to claim 17 further comprising:
   a control transistor connected between a gate of said MOS transistor and said drain of said first transistor, said control transistor having a gate connected to a precharge signal.

19. The apparatus according to claim 1, wherein said memory cell is a flash memory cell.

20. An integrated circuit, said integrated circuit comprising:
   a memory device, said memory device comprising at least one electrically programmable and electrically erasable memory cell; and
   at least one sense amplifier circuit for sensing a logic state of said at least one electrically programmable and electrically erasable memory cell, said at least one sense amplifier circuit comprising:
      a first circuit which selectively provides current in a first current path in accordance with a stored charge level read from a memory cell, said first circuit comprising:
         a first transistor having a source, a drain, and a gate, said source being connected to said memory cell;
         a resistive element connected between a supply voltage and said drain of said first transistor; and
         a second transistor connected between said supply voltage and said source of said first transistor, said second transistor having gate connected to said drain of said first transistor;
      a second circuit coupled to said first circuit which provides current in a second current path when there is current flow in said first current path;
      an integrator for integrating said current flow in said second current path; and
      a third circuit responsive to an output of said integrator which provides an output signal representing a logic state corresponding to said stored charge level read from said memory cell.

21. The integrated circuit according to claim 20, wherein said second circuit comprises:

a third transistor connected between said supply voltage and a reference node, said integrator being connected to said reference node.

22. The integrated circuit according to claim 20, wherein said gate of said first transistor is connected to a reference voltage.

23. The integrated circuit according to claim 21, wherein a gate of said third transistor is connected to said gate of said second transistor.

24. The integrated circuit according to claim 20, wherein said integrator comprises:

an integrating component connected between said reference node and a second supply voltage.

25. The integrated circuit according to claim 24, wherein said integrating component is a capacitor.

26. The integrated circuit according to claim 24, wherein said integrating component is a transistor.

27. The integrated circuit according to claim 24 further comprising:

a precharge circuit, said precharge circuit providing a fixed reference voltage at said reference node before said stored charge level is read from said memory cell.

28. The integrated circuit according to claim 27, wherein said precharge circuit further comprises:

a fourth transistor connected between said reference node and said second supply voltage; and a precharge signal connected to a gate of said fourth transistor through a delay element.

29. The integrated circuit according to claim 28, wherein said delay element comprises at least one inverter.

30. The integrated circuit according to claim 24, wherein said second supply voltage is a ground potential.

31. The integrated circuit according to claim 20, wherein said third circuit comprises:

a comparator having a first input, a second input and an output, said first input being connected to said reference node, said second input being connected to a second reference voltage; and an output line, said output line being connected to said output of said comparator and conducting an output signal determined by comparing a voltage at said reference node and said second reference voltage.

32. The integrated circuit according to claim 31, wherein when said voltage at said reference node increases above said second reference voltage, said output of said comparator switches.

33. The integrated circuit according to claim 20, wherein said third circuit comprises:

a Schmitt trigger, said Schmitt trigger having an input and an output, said input being connected to said reference node.

34. The integrated circuit according to claim 33 further comprising:

an inverter connected to said output of said Schmitt trigger.

35. The integrated circuit according to claim 20, wherein said resistive element is a resistor.

36. The integrated circuit according to claim 20, wherein said resistive element is a MOS transistor.

37. The integrated circuit according to claim 36 further comprising:

a control transistor connected between a gate of said MOS transistor and said drain of said first transistor, said control transistor having a gate connected to a precharge signal.

38. A processor system comprising:

a central processing unit; and an integrated circuit, said integrated circuit comprising a memory device, said memory device comprising at least one electrically programmable and electrically erasable memory cell;

at least one sense amplifier circuit for sensing a logic state of said at least one electrically programmable and electrically erasable memory cell, said at least one sense amplifier circuit comprising:

a first circuit which selectively provides current in a first current path in accordance with a stored charge level read from a memory cell, said first circuit comprising:

a first transistor having a source, a drain, and a gate, said source being connected to said memory cell;

a resistive element connected between a supply votage and said drain of said first transistor; and a second transistor connected between said supply voltage and said source of said first transistor, said second transistor having a gate connected to said drain of said first transistor;

a second circuit coupled to said first circuit which provides current in a second current path when there is current flow in said first current path;

an integrator for integrating said current flow in said second current path; and a third circuit responsive to an output of said integrator which provides an output signal representing a logic state corresponding to said stored charge level read from said memory cell.

39. The processor system according to claim 38, wherein said second circuit comprises:

a third transistor connected between said supply voltage and a reference node, said integrator being connected to said reference node.

40. The processor system according to claim 38, wherein said gate of said first transistor is connected to a reference voltage.

41. The processor system according to claim 39, wherein a gate of said third transistor is connected to said gate of said second transistor.

42. The processor system according to claim 38, wherein said integrator comprises:

an integrating component connected between said reference node and a second supply voltage.

43. The processor system according to claim 42, wherein said integrating component is a capacitor.

44. The processor system according to claim 42, wherein said integrating component is a transistor.

45. The processor system according to claim 42 further comprising:

a precharge circuit, said precharge circuit providing a fixed reference voltage at said reference node before said stored charge level is read from said memory cell.

46. The processor system circuit according to claim 45, wherein said precharge circuit further comprises:

a fourth transistor connected between said reference node and said second supply voltage; and a precharge signal connected to a gate of said fourth transistor through a delay element.

47. The processor system according to claim 46, wherein said delay element comprises at least one inverter.

48. The processor system according to claim 42, wherein said second supply voltage is a ground potential.

49. The processor system according to claim 38, wherein said third circuit comprises:
a comparator having a first input, a second input and an output, said first input being connected to said reference node, said second input being connected to a second reference voltage; and
an output line, said output line being connected to said output of said comparator and conducting an output signal determined by comparing a voltage at said reference node and said second reference voltage.

50. The processor system according to claim 49, wherein when said voltage at said reference node increases above said second reference voltage, said output of said comparator switches.

51. The processor system according to claim 38, wherein said third circuit comprises:
a Schmitt trigger, said Schmitt trigger having an input and an output, said input being connected to said reference node.

52. The processor system according to claim 51 further comprising
an inverter connected to said output of said Schmitt trigger.

53. The processor system according to claim 38, wherein said resistive element is a resistor.

54. The processor system according to claim 38, wherein said resistive element is a MOS transistor.

55. The processor system according to claim 54 further comprising:
a control transistor connected between a gate of said MOS transistor and said drain of said first transistor, said control transistor having a gate connected to a precharge signal.

56. A method for sensing a logic state of a memory cell, said method comprising the steps of:
accessing said memory cell, said memory cell conducting in accordance with a level of charge stored in said memory cell;
producing a first current flow associated with a conduction of said memory cell by passing a current through a resistive element, thereby causing an associated voltage drop across said resistive element, and turning on a first transistor by said voltage drop, whereby said first current flow will pass through said first transistor;
producing a second current flow associated with said first current flow;
integrating said second current flow to produce a voltage signal proportional to said second current flow; and
outputting an output signal responsive to said integrated second current flow representing said logic state of said accessed memory cell determined by said stored charge level from said accessed memory cell.

57. The method according to claim 56, wherein said producing a second current flow step further comprises:
turning on a second transistor by said voltage drop, whereby a second current flow will pass through said second transistor to an integrator.

58. The method according to claim 57, wherein said integrating step further comprises:
passing said second current flow through an integrating component; and
producing a voltage signal proportional to a value and time of said second current flow.

59. The method according to claim 58, wherein said integrating component is a capacitor.

60. The method according to claim 58, wherein said integrating component is a transistor.

61. The method according to claim 58, wherein said outputting step further comprises:
using a comparator to compare said voltage signal to a reference voltage and output a signal representing said logic state based on said comparison.

62. The method according to claim 58, wherein said outputting step further comprises:
using a Schmitt trigger to output an output signal representing said logic state based on said voltage signal.

63. The method according to claim 56 further comprising:
supplying a fixed reference voltage from a precharge signal.

* * * * *